United States Patent [19]

James et al.

[11] Patent Number: 4,703,307

[45] Date of Patent: Oct. 27, 1987

[54] SYNCHRO/RESOLVER SHAFT ANGLE CONVERTER APPARATUS

[75] Inventors: Robert James, Bloomfield; Jacob H. Malka, Fair Lawn, both of N.J.

[73] Assignee: Allied Corporation, Morris Township, Morris County, N.J.

[21] Appl. No.: 826,403

[22] Filed: Feb. 5, 1986

[51] Int. Cl.[4] .............................................. H03M 1/64

[52] U.S. Cl. ........................ 340/347 SY; 340/347 DA

[58] Field of Search .................. 340/347 SY, 347 DA

[56] References Cited

U.S. PATENT DOCUMENTS 3,728,719 4/1973 Fish .............................. 340/347 SY 4,072,940 2/1978 Simon ........................... 340/347 SY 4,130,875 12/1978 Lanton .......................... 340/347 SY

*Primary Examiner*—Charles D. Miller

*Attorney, Agent, or Firm*—Howard G. Massung; Stanley N. Protigal

[57] ABSTRACT

Apparatus is disclosed which is controlled via computer interface logic for converting digital signals corresponding to predetermined synchro/resolver shaft angles into analog signals for stimulus purposes, and for converting the analog signals into digital words for measurement purposes. External synchro/resolver shaft angle signals may be converted into digital words for like purposes. The apparatus has a plurality of converter channels, each of which is controlled by the computer interface logic for operation independent of the other channels. The apparatus so configured is particularly adaptable for providing stimuli and measurements which are useful in test systems applications.

12 Claims, 4 Drawing Figures

SYNCHRO/RESOLVER SHAFT ANGLE CONVERTER APPARATUS

BACKGROUND OF THE INVENTION

Automatic test equipment such as, for example, that used for testing avionics systems, requires internally generated stimuli corresponding to particular paratmeters to be tested, and further requires that the generted stimuli be measured to determine their accuracy. Additionally, it is desirable that the test equipment have the capability of measuring externally generated signals corresponding to the particular parameters.

A common parameter to be tested by test equipment of the type described is synchro/resolver shaft angle, i.e. the angular position of a synchro/resolver shaft. Prior to the present invention, apparatus for generating synchro/resolver shaft angle stimuli and for measuring such stimuli has been somewhat cumbersome, requiring complicated circuitry including switching arrangements and the like. This has been particularly true when stimuli corresponding to various shaft angles need to be generated and measured.

Accordingly, it is the main object of this invention to overcome the aforenoted disadvantages of the prior art by providing apparatus including digital and analog components for generating, via computer interface control, analog synchro/resolver shaft angle output stimuli from digital shaft angle inputs, and for measuring said stimuli by providing digital shaft angle outputs therefrom. The invention has the further capability of providing digital shaftr angle outputs from externally generated analog shaft angle inputs, and for measuring said inputs.

It is another object of the invention to achieve a desirable versatility in that a plurality of independently controlled simultaneously operated signal generating and measuring channels are provided, each of which is responsive to different shaft angle information.

SUMMARY OF THE INVENTION

This invention contemplates apparatus of the type described including a plurality of channels, each having a digital to synchro/resolver converter for converting digital signals to AC analog synchro/resolver signals, and at least one channel having a synchro/resolver to digital converter for converting the analog signals to digital signals for measurement purposes. The digital to synchro/resolver converters are responsive to digital signals containing different shaft angle information, and to an AC reference signal which provides a carrier for the analog signals. Each of the digital to synchro/-resolver converters is independently controlled and simultaneously operated to provide output analog signals with different shaft angle information; different carrier signal phase angles; and different output amplitudes. Computer interface logic generates control signals for controlling the apparatus in accordance with the above.

DETAILED DESCRIPTION OF THE INVENTION

Figure 1:
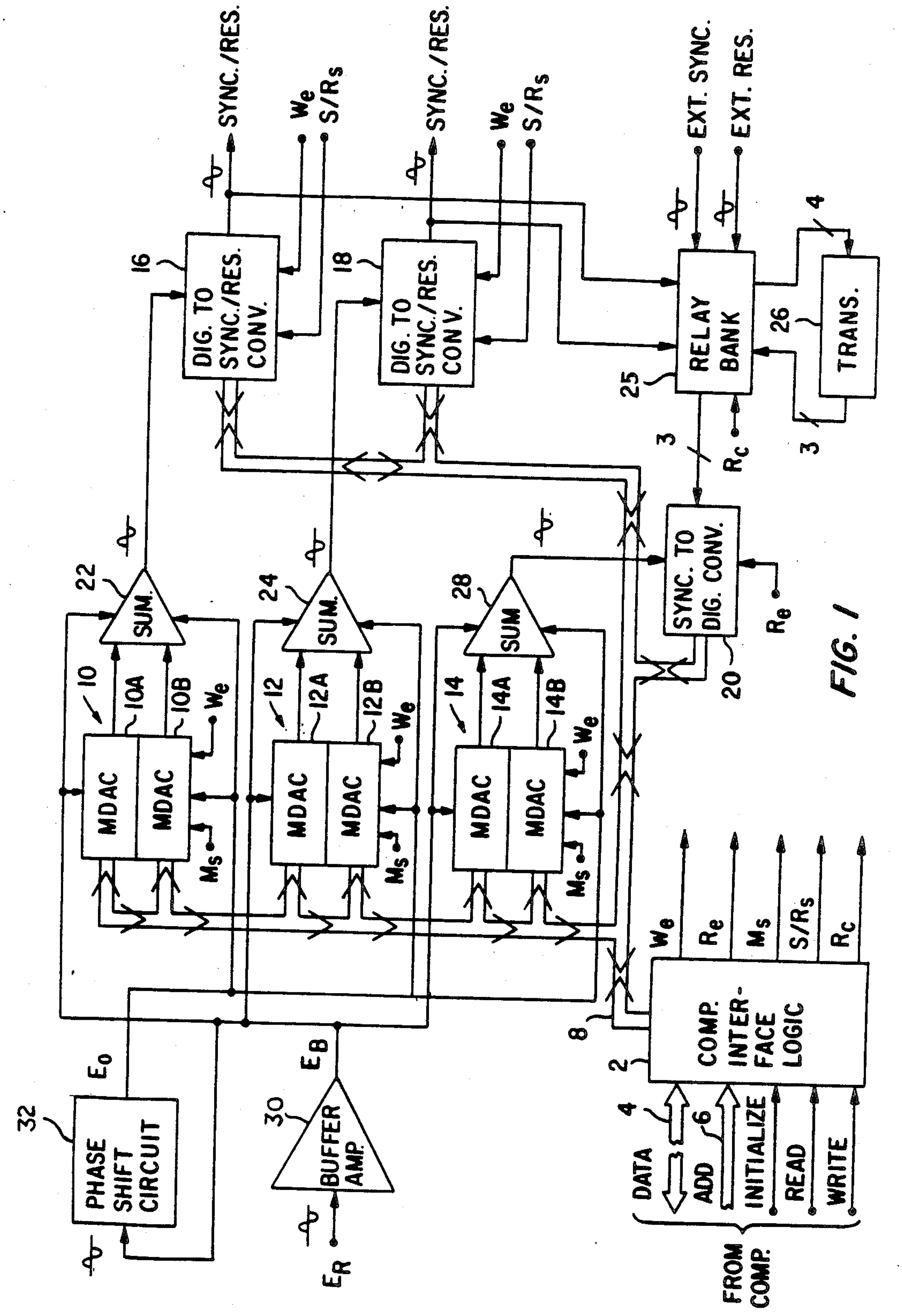
FIG. 1 is a block diagram of converter apparatus according to the invention.

With reference first to FIG. 1, computer interface logic is designated by the numeral 2. Interface logic 2 communicates with the computer (not otherwise shown) via an input/output data bus 4 and an address bus 6, and receives initialize, read and write commands from the computer. Computer interface logic 2 is responsive to the input and address data and to the commands from the computer for providing control signals including a write enable signal ($W_e$), a read enable signal ($R_e$), a multiplying digital to analog converter select signal ($M_S$), a synchro/resolver select signal ($S/R_S$), and a relay control signal ($R_C$), for purposes to be hereinafter described.

Computer interface logic 2 communicates via an internal input/output data bus 8 with a dual multiplying digital to analog converter (MDAC) arrangement designated by the numeral 10; with a dual MDAC arrangement designated by the numeral 12; and with a dual MDAC arrangement designated by the numeral 14. Computer interface logic 2 communicates via bus 8 with a digital to synchro/resolver converter 16; a digital to synchro/resolver converter 18; and a synchro to digital converter 20.

MDAC arrangement 10 includes an MDAC 10A and an MDAC 10B; MDAC arrangement 12 includes an MDAC 12A and an MDAC 12B; and MDAC arrangement 14 includes an MDAC 14A and an MDAC 14B.

It will now be recognized that FIG. 1 shows an arrangement which, for purposes of description, includes two digital to synchro/resolver converter channels and one synchro to digital converter channel. It will be understood that additional digital to synchro/resolver converter channels and additional synchro to digital converter channels may be employed in accordance with the invention, depending on the ultimate use of the apparatus to be herein described.

Digital to synchro/resolver converter 16 receives, for example, a 16 bit digital word corresponding to a predetermined shaft angle, and which digital word is applied to converter 16 via input/output bus 8. Converter 16 converts this digital word into either a three wire format analog AC synchro (SYNC.) shaft angle signal or a four wire format analog AC resolver (RES.) shaft angle signal in accordance with signal $S/R_S$ from computer interface logic 2. An AC reference signal provided by a summing amplifier 22 is applied to converter 16 for providing the AC carrier for the synchro or resolver signals provided by the converter.

Digital to synchro/resolver 18 receives another 16 bit digital word corresponding to another predetermined shaft angle applied via input/output bus 8, and likewise converts this word into either a three wire format analog AC synchro shaft angle signal or a four wire format analog shaft AC resolver signal in accordance with signal $S/R_S$ from computer interface 2. In this connection it is noted that converter 18 is structurally and functionally identical to converter 16. Converter 18 receives an AC reference signal from a summing amplifier 24, and which reference signal provides the AC carrier for the synchro or resolver outputs provided by converter 18.

It will now be understood that converters 16 and 18 may be controlled via computer interface logic 2 independently of each other. Both converters can be operated simultaneously and arranged to provide different shaft angle information at their outputs. Further, as will be hereinafter described, the carrier signals provided by summing amplifiers 22 and 24 may have different phase angles and different amplitudes, as controlled via computer interface logic 2. The simultaneous output feature is made possible by data latches in each of the converters 16 and 18 separately written into the converters by signal $W_e$ from computer interface logic 2.

Synchro to digital converter 20 receives the analog synchro or resolver shaft angle signals from converters 16 and 18 and provides a corresponding digital shaft angle output signal. This signal is read in response to signal $R_e$ from computer interface logic 2 and applied via input/output bus 8 to the computer interface logic, and therefrom to the computer which provides a measurement of the synchro or resolver shaft angle output. Converter 20 also receives external analog synchro (SYNC.) or external analog resolver (RES.) shaft angle signals and likewise provides a corresponding digital signal for providing a measurement of the external signals.

In the arrangement shown and described synchro to digital converter 20 can accept only three wire AC synchro signals. Accordingly, the analog synchro or resolver signals from converters 16 and 18 and the external analog AC synchro or resolver signals are applied to converter 20 through a relay bank 25. Relay bank 25 includes a relay arrangement actuated by signal $R_c$ from computer interface logic 2 for switching the resolver signals applied thereto to converter 20. Hence, relay bank 25 switches any incoming four wire resolver signals through a transformer arrangement 26 which transforms the four wire inputs into a three wire synchro format such as is acceptable by converter 20. For this purpose relay bank 25 may inclue a plurality of conventional electro-mechanical relays and transformer 26 may be a conventional Scott-T transformer arrangement.

A summing amplifier 28 provides a reference signal for converter 20, such as provided by summing amplifiers 22 and 24 for converters 16 and 18, respectively, and as wil be hereinafter described.

A buffer amplifier is designated by the numeral 30 and is, in effect, an operational amplifier for providing isolation and attenuation of an AC reference signal $E_R$ provided by an external reference signal source (not otherwise shown). Amplifier 30 provides a constant amplitude output signal $E_B$. Signal $E_B$ is applied to a phase shift circuit 32 and is applied to MDAC 10A, MDAC 12A and MDAC 14A; and is also applied as a biasing signal to summing amplifiers 22, 24 and 28. Phase shift circuit 32, operable in a manner to be hereinafter described, provides an output signal $E_O$ which is applied to MDAC 10B, MDAC 12B and MDAC 14B. Signal $E_O$ is likewise applied as a biasing signal to summing amplifiers 22, 24 and 28.

As heretofore noted, the AC reference signals from summing amplifiers 22, 24 and 28 are adjustable via computer interface logic 2 in both amplitude and phase. Referring for purposes of example to MDAC arrangement 10, MDAC 10A attenuates signal $E_B$ from buffer amplifier 30 by an amount proportional to a digital signal applied to MDAC 10A from computer interface logic 2 via input/output bus 8. Similarly, MDAC 10B attenuates signal $E_O$ from phase shift circuit 32 proportional to another digital signal applied thereto via input/output bus 8. In this connection it is noted that signal $E_O$, like signal $E_B$, is a constant amplitude signal, except that it is shifted in phase from signal $E_O$ by 90 degrees by phase shift circuit 32. Hence MDAC's 10A and 10B of MDAC arrangement 10 adjust separately, in response to signals $M_s$ and $W_e$ from computer interface 2, the relative amplitudes of two quadrature related components, the vector sum of which becomes the AC reference signal for converter 16. This reference signal has a variable amplitude and phase depending on the controlling digital signal inputs, and is provided by summing amplifier 22 connected to MDAC's 10A and 10B. MDAC arrangements 12 and 14 function in a like manner in association with amplifiers 24 and 28, respectively, to provide variable phase and variable amplitude reference signals for converters 18 and 20, as will now be understood.

Figure 2:
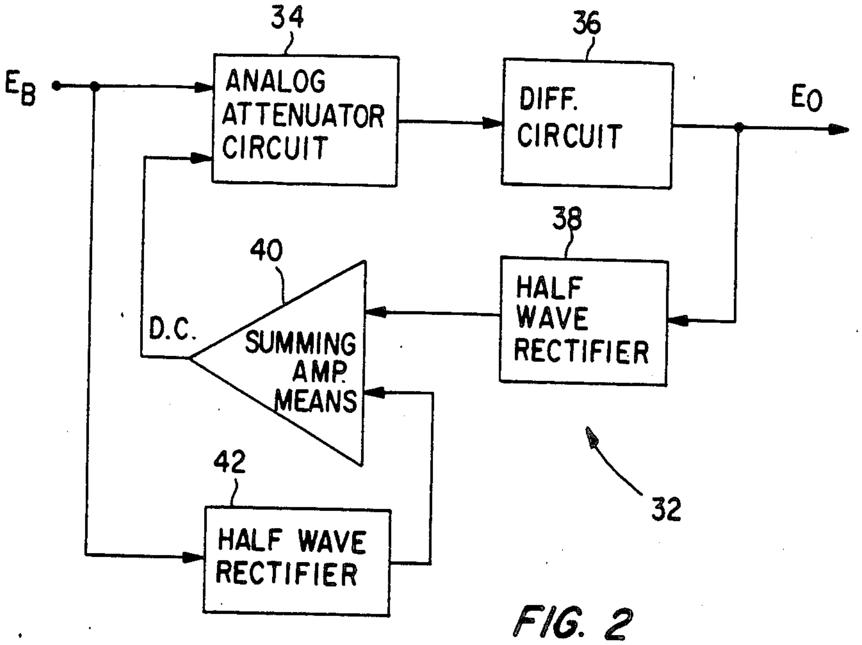
FIG. 2 is a block diagram of a phase shift circuit 32 shown generally in FIG. 1.
Figure 3:
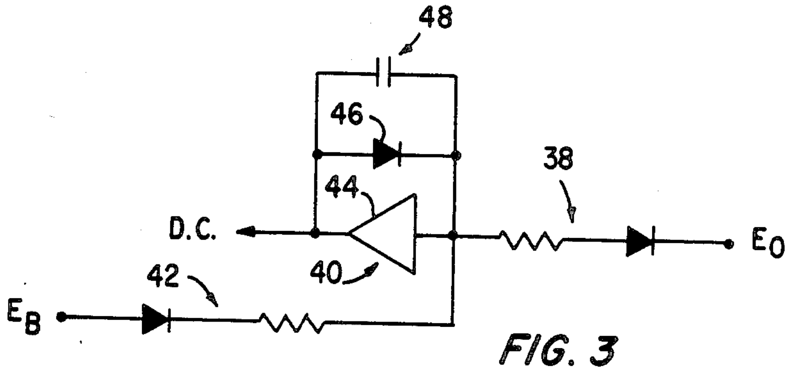
FIG. 3 is an electrical schematic diagram illustrating an amplitude correcting feedback feature of phase shift circuit 32 shown generally in FIG. 1, and shown in block diagram form in FIG. 2.

The structure and operation of phase shift circuit 32 as heretofore noted is best understood with reference to FIGS. 2 and 3. Thus phase shift circuit 32 includes an analog attenuator circuit 34 which receives signal $E_B$. Signal $E_B$ is a constant amplitude signal as aforenoted and has an amplitude of, for example, 6.5 volts RMS, and a variable frequency in the range of 400 to 2400 HZ. Phase shift circuit 32 provides output signals $E_O$ having a constant amplitude over the aforenoted frequency range with a 90 degree phase lead with respect to signal $E_B$. The aforenoted phase lead is accomplished by a differentiator circuit 36 which receives the output put of analog attenuator circuit 34 and provides phase shift circuit output $E_O$.

Output $E_O$ is applied to a half-wave rectifier 38 and therefrom to a DC summing amplifier means 40. Input signal $E_B$ is applied to a half-wave rectifier 42 and therefrom to summing amplifier means 40. Summing amplifier means 40 provides a DC output which is applied to analog attenuator circuit 34. It will now be recognized that differentiator circuit 36, half-wave rectifier 38, summing amplifier means 40 and half-wave rectifier 42 are connected in feedback relation to analog attenuator circuit 34.

Reference is now made to FIG. 3. It will be seen that amplifier means 40 includes an amplifier designated by the numeral 44. A diode 46 is connected in feedback relation with amplifier 44 and a capacitor 48 is connected across diode 46.

It will be understood that in order for proper operation of phase shift circuit 32 negative feedback is required. Diode 46 is arranged with amplifier 44 to insure that any positive feedback which may occur is nullified and capacitor 48 functions as a filtering capacitor and to prevent circuit oscillation, as will be recognized as required for proper operation of the circuit.

Figure 4:
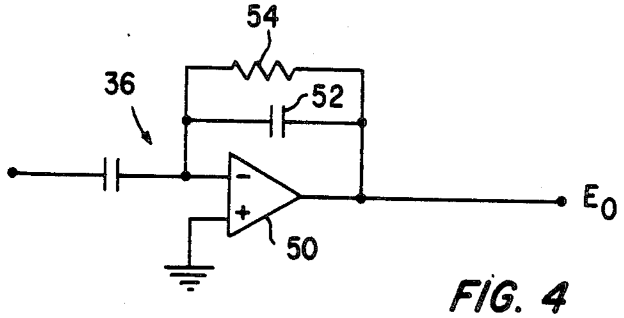
FIG. 4 is an electrical schematic diagram of a differentiator circuit 36 shown generally in FIG. 2.

With reference to FIG. 4, which is a schematic diagram of differentiator circuit 36 shown generally in FIG. 2, it will be seen that the differentiator circuit which accomplishes the aforenoted 90 degree phase shift is implemented by a feedback loop connected about an operational amplifier 50. The feedback loop includes a noise filtering capacitor 52 connected to the inverting input of the operational amplifier and to the output thereof. A resistor 54 is connected, for negative feedback purposes, in parallel with capacitor 52.

Differentiator circuit 36, like any true differentiator circuit, will experience an increase in output amplitude with frequency. However, as heretofore noted, the arrangement described provides a constant output amplitude over the entire frequency range. Accordingly, automatic gain control circuitry is required so that the amplitude of signal $E_O$ from differentiator circuit 36 is constant for all frequencies in the frequency range.

The aforenoted automatic gain control is accomplished as shown in FIGS. 2 and 3. Thus, phase shift circuit 32 compares output and input amplitudes via summing amplifier means 40 after conversion to average amplitude DC signals via half-wave rectifiers 38 and 42, the outputs of which are applied to summing amplifier means 40. It will be recognized that summing amplifier means 40 is in a relatively high gain configuration. The relatively high gain DC output from summing amplifier means 40 controls the gain of analog attenuator circuit 34. In this way any amplitude difference between the input signal ($E_B$) to and the output signal ($E_O$) from phase shift circuit 32 provides sufficient control to analog attenuator circuit 34 so that it attenuates input signal $E_B$ to bring the amplitude of the input signal substantially equal to the output signal amplitude, as is required.

In accordance with the aforegoing description of the invention, converter apparatus has been described which includes both analog and digital components for providing synchro/resolver shaft angle information in the form of three or four wire analog output formats derived from given digital shaft angle inputs, and for providing digital shaft angle outputs from said analog outputs, or from external shaft angle inputs. The converter apparatus is controlled by a computer via computer interface logic.

It will be understood that, except where otherwise particularly described, the novelty of the invention resides in the arrangement of the components thereof and not in the components themselves. The several components are commercially available components. In this regard computer interface logic 2 may be the IEEE standard 488 interface as described in the publication "IEEE Standard Digital Interface for Programmable Instrumentation" published in 1983 by the Institute of Electrical and Electronics Engineers, Inc., New York, N.Y. Dual MDAC's 10, 12 and 14 may each be a pair of MDAC's of the type marketed by Analog Devices, Inc., Norwood, Mass. under their trade designation AD7541A. Digital to synchro/resolver converters 16 and 18 may be of the type marketed by Natel Engineering Co., Inc., Chatsworth, Calif. under their trade designation DSC5001/DRC5001 and synchro to digital converter 20 may be of the type marketed by the aforenoted Natel Engineering Co., Inc. under their trade designator HSRD1006.

With the above description of the invention in mind, reference is made to the claims appended hereto for a definition of the scope of the invention.

What is claimed is:

1. Synchro/resolver shaft angle converter apparatus characterized by:

logic means for providing digital signals and for providing a first control signal, a second control signal and a third control signal;

digital to synchro/resolver converter means connected to the logic means and receiving digital signals therefrom corresponding to predetermined synchro/resolver shaft angles, and responsive to the first control signal from the logic means for converting the digital signals to analog signals, said digital signals being in one format of an analog synchro shaft angle format and an analog resolver shaft angle format in response to the second control signal from the logic means;

means connected to the logic means and receiving other digital signals therefrom, and receiving an external reference signal, and controlled by the first control signal and the third control signal from the logic means and responsive to the other digital signals and the external reference signal for providing reference signals having a variable amplitude and phase; and the digital to synchro/resolver converter means connected to the means for providing reference signals having a variable amplitude and phase, and receiving reference signals therefrom as carrier signals for the analog signals.

2. Synchro/resolver shaft angle converter apparatus as described by claim 1, further characterized by:

the logic means providing a fourth control signal and a fifth control signal;

means connected to the digital to synchro/resolver converter means for receiving the analog signals in the one format of the analog synchro angle format and the analog resolver shaft angle format, and connected to the logic means and controlled by the fourth control signal therefrom for providing analog signals in the synchro shaft angle format;

synchro to digital converter means connected to the means for providing analog signals in the synchro shaft angle format and connected to the logic means, and controlled by the fifth control signal from the logic means for converting the analog signals to digital signals;

the logic means receiving the digital signals, whereby said digital signals are measured; and the synchro to digital converter means connected to the means providing reference signals having a variable amplitude and phase, and receiving reference signals therefrom as carrier signals for the analog signals converted thereby.

3. Synchro/resolver shaft angle converter apparatus as described by claim 2, further characterized by:

the means connected to the digital to synchro/-resolver converter means for receiving the analog signals in the one format, and connected to the logic means and controlled by the fourth control signal therefrom for providing analog signals in the synchro shaft angle format, receiving external analog signals in one format of the synchro shaft angle format and the resolver shaft angle format, and responive to the fourth control signal from the logic means for providing analog signals in the synchro shaft angle format.

4. Synchro/resolver shaft angle apparatus as described by claim 1, wherein the means for providing reference signals having a variable amplitude and phase is characterized by:

means responsive to an external reference signal for providing a constant amplitude signal of a particular phase;

means connected to the constant amplitude signal means for shifting the phase of the signal therefrom and for providing a phase shifted signal;

first means connected to the constant amplitude signal means for adjusting the gain of the constant amplitude signal commensurate with first digital signals of the other digital signals and for providing first gain adjusted signals;

second means connected to the means for providing a phase shifted signal for adjusting the gain of the phase shifted signal commensurate with second digital signals of the other digital signals and for providing second gain adjusted signals; and third means connected to the first and second means for summing the gain adjusted signals therefrom and for providing the reference signals having a variable amplitude and phase.

5. Synchro/resolver shaft angle apparatus as described by claim 4, wherein the means connected to the constant amplitude signal means for shifting the phase of the signal therefrom and for providing a phase shifted signal is characterized by:

means for adjusting the gain of the constant amplitude signal, said signal having a constant amplitude over a predetermined frequency range, and for providing a gain adjusted signal;

means connected to the means for providing a gain adjusted signal for shifting the phase of the signal therefrom and for providing a gain adjusted, phase shifted signal;

means connected to the constant amplitude signal means and responsive to the signal therefrom for providing a first DC signal;

means connected to the means for providing a gain adjusted, phase shifted signal and responsive to the signal therefrom for providing a second DC signal;

means connected to the means for providing the first DC signal and to the means for providing the second DC signal for summing the signals therefrom and for providing a summation signal; and the means for adjusting the gain of the signal having a constant amplitude over a predetermined frequency range connected to the summing means, with the summation signal from the summing means controlling the gain adjustment means so that the signal therefrom having a constant amplitude over a predetermined frequency range and the phase shifted signal are substantially equal in amplitude.

6. Synchro/resolver shaft angle converter apparatus characterized by:

logic means for providing digital signals and for providing a first control signal, a second control signal and a third control signal;

a plurality of digital to synchro/resolver converters, each of which plurality of converters is connected to the logic means for receiving digital signals therefrom corresponding to different predetermined synchro/resolver shaft angles;

each of the plurality of digital to synchro/resolver converters responsive to the first control signal from the logic means for converting the digital signals to analog signals, and responsive to the second control signal from the logic means for providing the analog signals in one format of an analog synchro shaft angle format and an analog resolver shaft angle format;

a plurality of means for providing reference signals, each of said means connected to the logic signal means and receiving different other digital signals therefrom, and receiving an external reference signal, and controlled by the first control signal and the third control signal from the logic means and responsive to the different other digital signals and the external reference signal for providing a reference signal having a variable amplitude and phase; and each of the plurality of digital to synchro/resolver converter means connected to a corresponding reference signal means and receiving the reference signal therefrom as a carrier signal for the analog signal provided thereby.

7. Synchro/resolver shaft angle converter apparatus as described by claim 6, characterized by:

the logic means providing a fourth control signal and a fifth control signal;

at least one converter connected to each of the digital to synchro/resolver converters and connected to the logic means, and responsive to the fourth and fifth control signals from the logic means for converting the analog signals in the one format to digital signals; and the logic means receiving the digital signals, whereby said digital signals are measured.

8. Synchro/resolver shaft angle converter apparatus as described by claim 7, wherein the converter is characterized by:

means connected to each of the digital to synchro/-resolver converters for receiving the analog signals therefrom in the one format, and responsive to the fourth control signal from the logic means for providing analog signals in the synchro shaft angle format;

a synchro to digital converter connected to the last mentioned means and responsive to the fifth control signal from the logic means for converting the analog signals to digital signals; and the synchro to digital converter connected to a corresponding means of the plurality of means for providing reference signals, and receiving the reference signal therefrom having a variable amplitude and phase as a carrier signal for the analog signals converted thereby.

9. Synchro/resolver shaft angle converter apparatus as described by claim 8, further characterized by:

the means connected to each of the digital to synchro/resolver converters for receiving the analog signals therefrom in the one format, and responsive to the fourth control signal from the logic means for providing analog signals in the synchro shaft angle format, receiving external analog signals in one format of the synchro shaft angle format and in the resolver shaft angle format and responsive to the fourth control signal from the logic means for providing analog signals in the synchro shaft angle format.

10. Synchro/resolver shaft angle apparatus as described by claim 6, further characterized by:

means responsive to an external reference signal for providing a constant amplitude signal of a particular phase;

means connected to the constant amplitude signal means for shifting the phase of the signal therefrom and for providing a phase shifted signal; and each of the plurality of means for providing reference signals including means responsive to the constant amplitude signal of a particular phase and to the phase shifted signal, and controlled by the first and third control signals from the logic means and responsive to the different other digital signals for providing the reference signal having the variable amplitude and phase.

11. Synchro/resolver shaft angle apparatus as described by claim 10, wherein the means included in each of the plurality of means for providing reference signals is characterized by:

first means connected to the constant amplitude signal means for adjusting the gain of the constant amplitude signal of a particular phase commensurate with first signals of the different other digital signals and for providing a first gain adjusted signal;

second means connected to the means for providing a phase shifted signal for adjusting the gain of the phase shifted signal commensurate with second signals of the different other digital signals and for providing a second gain adjusted signal; and third means connected to the first and second means for summing the gain adjusted signals therefrom and for providing the reference signal having the variable amplitude and phase.

12. Synchro/resolver shaft angle apparatus as described by claim 10, wherein the means connected to the constant amplitude signal means for shifting the phase of the signal therefrom and for providing a phase shifted signal is characterized by:

means for adjusting the gain of the constant amplitude signal, said signal having a constant amplitude over a predetermined frequency range, and for providing a gain adjusted signal;

means connected to the means for providing a gain adjusted signal for shifting the phase of the signal therefrom and for providing a gain adjusted, phase shifted signal;

means connected to the constant amplitude signal means and responsive to the signal therefrom for providing a first DC signal;

means connected to the means for providing a gain adjusted, phase shifted signal and responsive to the signal therefrom for providing a second DC signal;

means connected to the means for providing the first DC signal and to the means for providing the second DC signal for summing the signals therefrom and for providing a summation signal; and the means for adjusting the gain of the signal having a constant amplitude over a predetermined frequency range connected to the summing means, with the summation signal from the summing means controlling the gain adjustment of said gain adjustment means so that the signal therefrom and the phase shifted signal are substantially equal in amplitude.

* * * * *